United States Patent
Brief

(10) Patent No.: US 10,621,116 B2
(45) Date of Patent: Apr. 14, 2020

(54) NON-VOLATILE STORAGE DEVICE WITH ADAPTIVE DATA BUS INVERSION

(71) Applicant: C/O WESTERN DIGITAL TECHNOLOGIES, INC., San Jose, CA (US)

(72) Inventor: David Brief, Modiin (IL)

(73) Assignee: WESTERN DIGITAL TECHNOLOGIES, INC., Plano, TX (US)

( * ) Notice: Subject to any disclaimer, the term of this patent is extended or adjusted under 35 U.S.C. 154(b) by 47 days.

(21) Appl. No.: 15/617,411

(22) Filed: Jun. 8, 2017

(65) Prior Publication Data

US 2018/0357188 A1    Dec. 13, 2018

(51) Int. Cl.
G06F 13/16 (2006.01)
G06F 13/40 (2006.01)
G06F 13/42 (2006.01)

(52) U.S. Cl.
CPC ...... *G06F 13/1668* (2013.01); *G06F 13/4068* (2013.01); *G06F 13/42* (2013.01)

(58) Field of Classification Search
USPC .................. 710/11, 14, 20, 30, 33, 65, 105
See application file for complete search history.

(56) References Cited

U.S. PATENT DOCUMENTS

| | | | | |
|---|---|---|---|---|
| 4,813,011 A | * | 3/1989 | Kulakowski | G06F 3/0601 360/77.03 |
| 5,703,587 A | * | 12/1997 | Clark | H03M 1/68 341/118 |
| 6,046,943 A | * | 4/2000 | Walker | G06F 9/30156 365/189.05 |
| 8,364,881 B2 | * | 1/2013 | Urabe | G06F 13/1668 711/103 |
| 9,053,066 B2 | | 6/2015 | Ramachandra et al. | |
| 9,423,974 B2 | * | 8/2016 | Liu | G11C 8/18 |
| 9,946,612 B2 | * | 4/2018 | Hollis | G06F 11/1008 |
| 2003/0041223 A1 | * | 2/2003 | Yeh | G06F 13/1668 711/167 |
| 2004/0057525 A1 | * | 3/2004 | Rajan | G06F 13/4072 375/257 |
| 2007/0067603 A1 | * | 3/2007 | Yamamoto | G06F 12/0246 711/207 |

(Continued)

OTHER PUBLICATIONS

NAND Extreme e.Mmc 5.0 HS400 I/F data sheet, SanDisk, 80-36-03680, Rev 1.11, Feb. 2015, 41 Pages.

(Continued)

*Primary Examiner* — Farley Abad
*Assistant Examiner* — Henry W Yu
(74) *Attorney, Agent, or Firm* — Vierra Magen Marcus LLP

(57) ABSTRACT

An apparatus includes an inversion circuit configured to invert a data word, a first partial-inversion circuit configured to invert a first portion of the data word, a second partial-inversion circuit configured to invert a second portion of the data word, and an output selection circuit configured to compare: the data word, an output of the inversion circuit, an output of the first partial-inversion circuit, and an output of the second partial-inversion circuit with a prior data word, and to select an output according to respective numbers of changed bits from the prior data word.

20 Claims, 9 Drawing Sheets

(56) References Cited

U.S. PATENT DOCUMENTS

| | | | |
|---|---|---|---|
| 2008/0086604 A1* | 4/2008 | Naso | G06F 13/16 711/154 |
| 2011/0093647 A1* | 4/2011 | Lai | G06F 13/1668 711/103 |
| 2011/0228615 A1* | 9/2011 | Shiga | G11C 7/1006 365/189.05 |
| 2014/0140152 A1* | 5/2014 | Takeyama | G11C 7/1084 365/198 |
| 2015/0155022 A1* | 6/2015 | Lee | G11C 8/10 365/230.06 |
| 2015/0227484 A1* | 8/2015 | Law | G06F 13/40 710/300 |

OTHER PUBLICATIONS

JEDEC, Embedded MultiMediaCard (e-Mmc) e-MMC/Card Product Standard, High Capacity, including Reliable Write, Boot, Sleep Modes, Dual Data Rate, Multiple Partitions Supports and Security Enhancement, JESD84-A44, Mar. 2009, 234 Pages.

Stan, et al., "Low-power encodings for global communication in CMOS VLSI," Very Large Scale Integration (VLSI) Systems, IEEE Transactions on , vol. 5, No. 4, pp. 444-455, Dec. 1997, 12 Pages.

Piestrak, S.J., "On Reducing Error Rate of Data Protected Using Systematic Unordered Codes in Asymmetric Channels," Digital System Design: Architectures, Methods and Tools (DSD), 2010 13th Euromicro Conference on , vol., No., pp. 133-140, Sep. 1-3, 2010, 2 Pages.

Nakamura, et al., "A 50% noise reduction interface using low-weight coding," VLSI Circuits, 1996. Digest of Technical Papers., 1996 Symposium on , vol., No., pp. 144-145, Jun. 13-15, 1996, 2 Pages.

Jeong-Don Ihm, et al., "An 80nm 4Gb/s/pin 32b 512Mb GDDR4 Graphics DRAM with Low-Power and Low-Noise Data-Bus Inversion," Solid-State Circuits Conference, 2007. ISSCC 2007. Digest of Technical Papers. IEEE International , vol., No., pp. 492-617, Feb. 11-15, 2007, 2 Pages.

Chiarulli, et al., "Area, power, and pin efficient bus transceiver using multi-bit-differential signaling," Circuits and Systems, 2005. ISCAS 2005. IEEE International Symposium on , May 2005, 4 Pages.

Henkel, et al., "A2BC: adaptive address bus coding for low power deep sub-micron designs," Design Automation Conference, 2001. Proceedings , 2001, 3 Pages.

* cited by examiner

|  | Ave Flip | Max Flips | Flip diff | Rms pwr (mA) | PWR diff |
|---|---|---|---|---|---|
| 8 bit data only | 4.08 | 8 |  | 49.62 |  |
| 10 bit code | 5.13 | 9 |  | 62.45 |  |
| inv only | 3.70 | 5 | 1.43 | 45.01 | 9% |
| 4 opts with ctl | 3.13 | 5 | 0.57 | 38.06 | 23% |
| 4 options inv | 3.08 | 4 | 0.04 | 37.54 | 24% |

FIG. 10

NON-VOLATILE STORAGE DEVICE WITH ADAPTIVE DATA BUS INVERSION

BACKGROUND

Many electronic apparatuses make use of embedded memory devices. Often, the embedded memory device includes non-volatile memory such as flash memory. An electronic apparatus that includes an embedded memory device (or is connected to a memory device) is often referred to as a host.

A memory device may connect to a host through an interface. A memory device may include a memory controller connected to one or more memory dies through an interface. An interface may transfer user data, commands, addresses, and other data between components. A physical interface may include a number of electrical conductors that transfer data as electrical signals. For example, electrical conductors may extend in parallel to form a bus. The physical arrangement of such conductors (e.g. pins, or lines), voltages, clock speeds, and other parameters may follow an agreed standard that provides compatibility between components.

BRIEF DESCRIPTION OF THE DRAWINGS

Like-numbered elements refer to common components in the different figures.

FIG. 10 illustrates aspects of different schemes including adaptive inversion.

DETAILED DESCRIPTION

Figure 1:
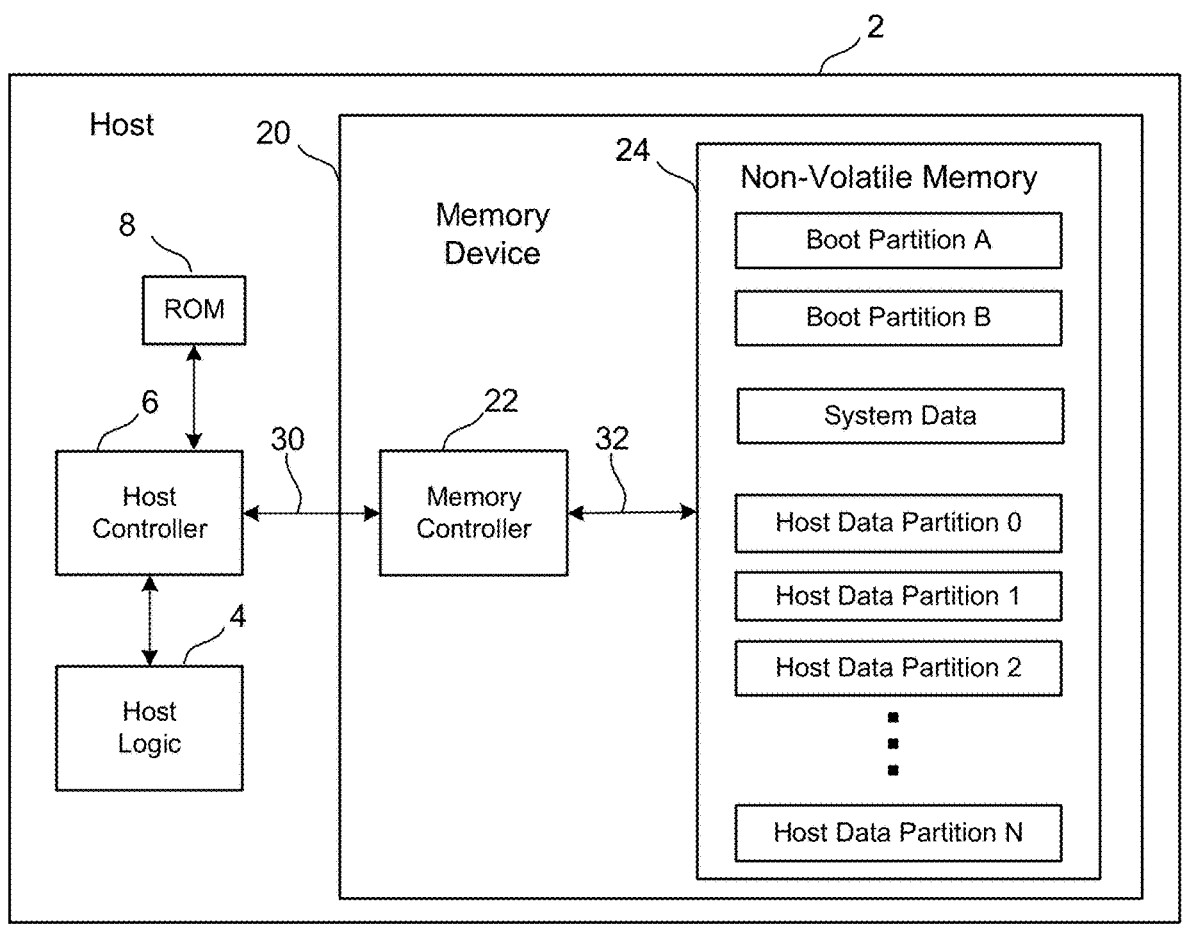
FIG. 1 is a block diagram of a memory device embedded in (and/or connected to) a host device.

A data bus is proposed that provides low Simultaneous Switching Output (SSO) noise and low power consumption at high switching speeds by using an adaptive Data Bus Inversion (DBI) scheme. SSO noise may be reduced using DBI by comparing a data word and its inverse with a prior data word to see which option (inverted or not-inverted) provides fewer changed (flipped) bits. The option providing fewer flipped bits is used and an additional bit may indicate whether the data word was flipped or not. For example, a one-byte data word 11111111 and its inverse 00000000 may be compared with a prior data word 00001010 and the inverted option may be selected because it results in two changed bits (flipped bits) instead of six. The smaller number of changed bits results in less SSO noise and lower power consumptions.

An example of an adaptive DBI scheme includes comparing not only a data word and its inverse with the prior data word, but also generating and comparing partially-inverted data words with the prior data word so that more options are compared and an option with fewer flipped bits may be obtained. To allow the use of additional inversion conditions, two or more bits, may indicate which inversion option was used.

For example, in addition to comparing a data word and its inverse, two partially-inverted data words may be generated and compared with a prior data word. A first partially-inverted data word may be generated by inverting a first half of the bits in the data word (e.g. four of eight bits of one-byte data word) while leaving a second half of the bits in the data word not-inverted. A second partially-inverted data word may be generated by inverting the second half of the bits in the data word while leaving the first half of the bits in the data word not-inverted. Two bits may be used to represent the four possible inversion conditions including inverted, not-inverted, first bits inverted, or second bits inverted.

Data-inversion data (e.g. two data-inversion bits indicating one of four possible inversion conditions) may be sent in various ways. In some buses, bus elements (e.g. electrical conductors such as traces, pins, or pads that convey electrical signals of the bus) may be configured to have multiple uses, for example, sending data-inversion data in addition to some other uses. For example, control lines that may not otherwise be needed during data transfer may be used to convey data-inversion data during data transfer. During other transfers, such as during a command transfer or an address transfer, these bus elements may be used to indicate a command or address transfer. In some cases, control lines may be repurposed during data transfer and may act as control lines at other times. For example, the Command Latch Enable (CLE) line and the Address Latch Enable (ALE) lines may be used to indicate transfer of a command (command signal) and an address (address signal) during command transfer and address transfer respectively. During data transfer, CLE and ALE lines may be used to indicate that a data word is being transferred.

Commands and addresses may be indicated by predetermined codes send on the data and control lines. Such a predetermined code may be smaller than the width of the data bus so that the remaining lines may be used to send command data or address data. For example, in an eight-bit (one-byte) data bus, four bits may be used for a predetermined code with the remaining four bits used to send the address data (address bits) or command data (command bits). This may be in addition to using command lines, such as CLE and ALE to further identify a command or address. Thus, each transfer is identifiable as a data transfer, command transfer, or address transfer, without reference to a previous transfer. While transfer of command and address data may only use half the data bus in this example, such transfers may be performed at high speed, for example performing a transfer on rising and falling edges of a clock cycle in a Toggle Mode (TM) scheme. It will be understood that a transfer refers to the transfer of a word on a bus, which may occur once per clock cycle in some bus protocols, or may occur twice per clock cycle (on a rising edge and on a falling edge of a clock signal) in other bus protocols.

Redundancy data may be generated for data transferred over a bus (including user data, command data, and/or address data) and may be identified in a similar manner to command data and address data. A predetermined code may indicate transfer of redundancy data (e.g. Cyclic Redundancy Check, or CRC data). This allows errors resulting from high speed data transfer to be identified and for data to be resent if necessary. Examples discussed here allow accurate high-speed data transfer with relatively low power requirements.

FIG. 1 is a block diagram depicting one embodiment of a memory device 20 embedded in a host 2. Host 2 includes host logic 4 for performing the intended functions of host 2. For example, host 2 can be a smartphone, PDA, laptop, set top box or another electronic device. Host logic 4 performs the functions of a smartphone, PDA, laptop, set top box, etc. Host logic 4 is connected to host controller 6 for communicating with memory device 20 via host interface 30. In one embodiment, memory device 20 is an eMMC memory device and host interface 30 is a MMC interface. Host controller 6 is also in communication with ROM 8. ROM 8 may store code to start the boot process for host 2.

Memory device 20 includes controller 22 (which may be considered a memory controller) in communication with non-volatile memory 24. Note that FIG. 1 shows a logical depiction of non-volatile memory 24. In one embodiment, non-volatile memory 24 can be implemented using one or multiple memory die. Interface 32 between controller 22 and non-volatile memory 24 maybe any suitable interface including toggle mode 200, 400, 800, 1200, or another interface. Interface 32 may use adaptive DBI as described in one or more of the examples described below. In other examples, adaptive DBI may be used in other data busses. The technology described is not limited to nonvolatile memory interfaces as shown in FIG. 1, is provided by way of example and is not limiting.

Figure 2:
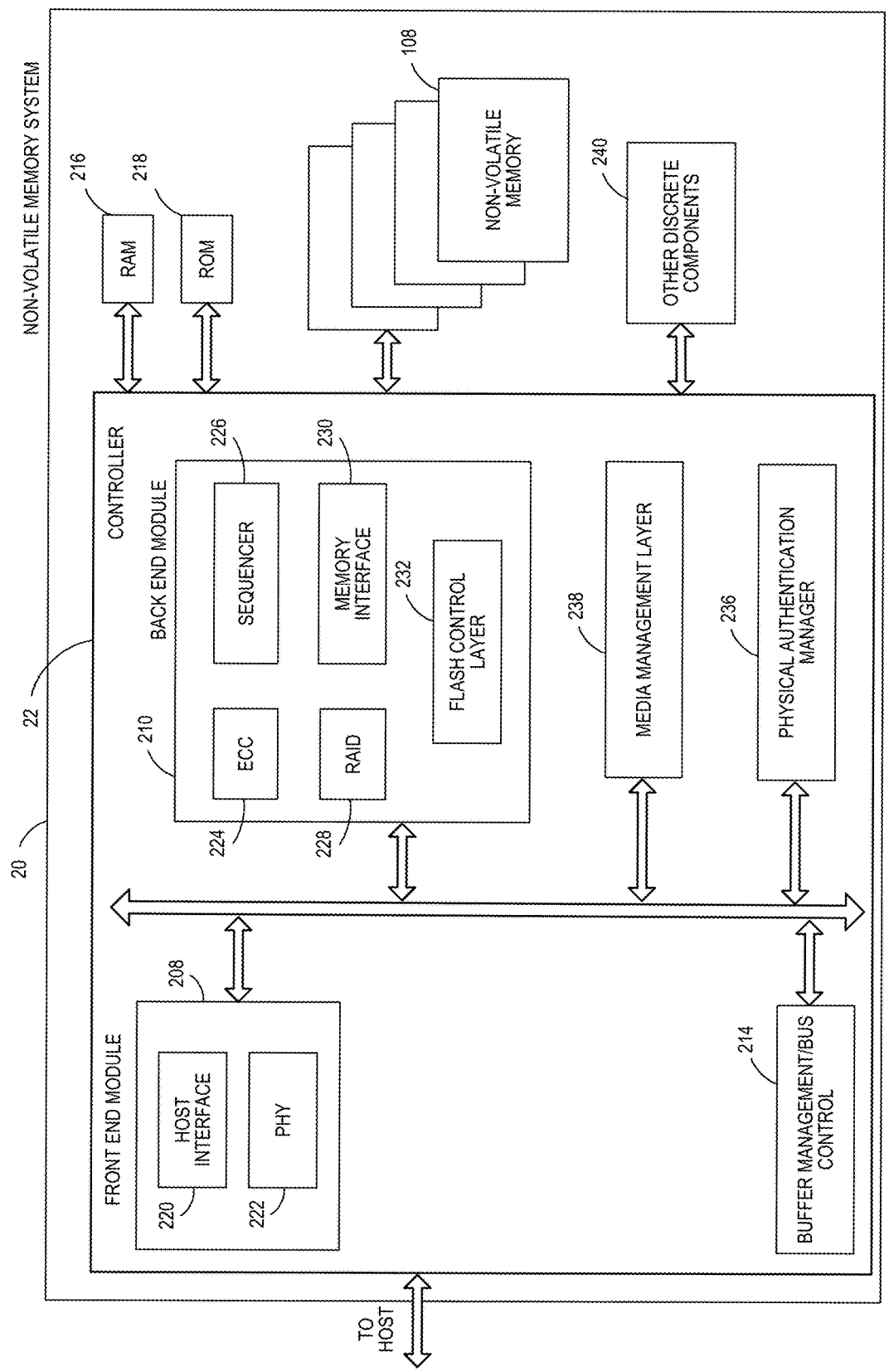
FIG. 2 is a block diagram of one example of a memory device.

FIG. 2 is a block diagram of one example of a memory device 20. However, the architecture depicted in FIG. 2 can also be used to implement other types of non-volatile storage devices. Memory device 20 includes a controller 22 connected to one or more non-volatile memory die 108 (which comprise the non-volatile memory 24 depicted in FIG. 1). As used herein, for a system that uses non-volatile memory, a controller is a device that manages data stored on the non-volatile memory and communicates with a host. Controller 22 can have various functionality in addition to the specific functionality described herein. For example, controller 22 can format the non-volatile memory to ensure the memory is operating properly, map out bad memory cells (the physical unit of storage), and allocate spare memory cells to be substituted for future failed cells. Some part of the spare memory cells can be used to hold firmware to operate the controller and implement other features. In operation, when a host needs to read data from or write data to the non-volatile memory, it will communicate with controller 22. If the host provides a logical address to which data is to be read/written, controller 22 converts the logical address received from the host to a physical address in the physical flash memory. Alternatively, the host can provide the physical address. Controller 22 can also perform various memory management functions,).

The interface between controller 22 and non-volatile memory die 108 may be through a bus that connects one or more non-volatile memory dies. Examples of bus standards include Toggle Mode 200, 400, 800, or 1200. In some embodiments, memory device 20 includes a single channel between controller 22 and non-volatile memory die 108; however, the subject matter described herein is not limited to having a single memory channel. For example, in some memory system architectures 2, 4, 8 or more channels may exist between controller 12 and memory die 108, depending on controller capabilities. In any of the embodiments described herein, more than a single channel may exist between controller 22 and memory die 108, even if a single channel is shown in the drawings.

As depicted in FIG. 2, controller 22 includes a front-end module 208 that interfaces with a host, a back-end module 210 that interfaces with the one or more non-volatile memory die 108, and various other modules that perform functions which will now be described.

The components of controller 22 depicted in FIG. 2 may take the form of a packaged functional hardware unit (e.g., an electrical circuit) designed for use with other components, program code (e.g., software or firmware) executable by a (micro) processor or processing circuitry that usually performs a particular function of related functions, or a self-contained hardware or software component that interfaces with a larger system. For example, each module may include an application specific integrated circuit (ASIC), a Field Programmable Gate Array (FPGA), an electrical circuit, a digital logic circuit, an analog circuit, a combination of discrete circuits, gates, or any other type of hardware or combination thereof. Alternatively, or in addition, each module may include software stored in a processor readable device (e.g., memory) to program a processor to perform the functions described herein.

Referring again to modules of the controller 22, a buffer manager/bus control 214 manages random access memory (RAM) 216 and controls the internal bus arbitration of controller 22. A read only memory (ROM) 218 stores boot code for the controller. Although illustrated in FIG. 2 as located separately from the controller 22, in other embodiments one or both of the RAM 216 and ROM 218 may be located within the controller. In yet other embodiments, portions of RAM and ROM may be located both within the controller 22 and outside the controller. Further, in some implementations, controller 22, RAM 216, and ROM 218 may be located on separate semiconductor die.

Front end module 208 includes a host interface 220 and a physical layer interface 222 (PHY) that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, MMC, UFS and NVMe. The host interface 220 typically facilitates transfer for data, control signals, and timing signals. In one embodiment, front end module 208 provides the single communication interface adapted to communicate with an external computing device for the controller 22 and memory die 108 of memory device 20.

Back end module 210 includes an error correction code (ECC) engine 224 that encodes the data bytes received from the host, and decodes and error corrects the data bytes read from the non-volatile memory die 108. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, 800 or 1200 interface and may apply an adaptive DBI scheme. A flash control layer 232 controls the overall operation of back end module 210.

Additional components of memory device 20 illustrated in FIG. 2 include media management layer 238, which performs wear leveling of memory cells of non-volatile memory die 108. Non-volatile memory system 100 also includes other discrete components 240, such as external electrical interfaces, external RAM, resistors, capacitors, or other components that may interface with controller 22. In alternative embodiments, one or more of the physical layer interface 222, RAID module 228, media management layer 238 and buffer management/bus controller 214 are optional components that are not necessary in the controller 22.

The Flash Translation Layer (FTL) or Media Management Layer (MML) 238 may be integrated as part of the flash management that may handle flash errors and interfacing with the host. In particular, MML is responsible for the internals of non-volatile memory management. In particular, the MML 238 may include an algorithm in the memory device firmware which translates writes from the host into writes to the memory of a memory die 108. The MML 238 may be needed because: 1) the memory may have limited endurance; 2) the memory may only be written in multiples of pages; and/or 3) the memory may not be written unless it is erased as a block. The MML 238 understands these potential limitations of the memory which may not be visible to the host. Accordingly, the MML 238 attempts to translate the writes from host into writes into the memory structure 126.

Controller 22 also includes physical authentication manager 236, which can be hardware only (e.g., electrical circuit) or software running on a processor. Physical authentication manager 236 manages the physical authentication process and the use of physical authentication to enable performance of a function.

Figure 3:
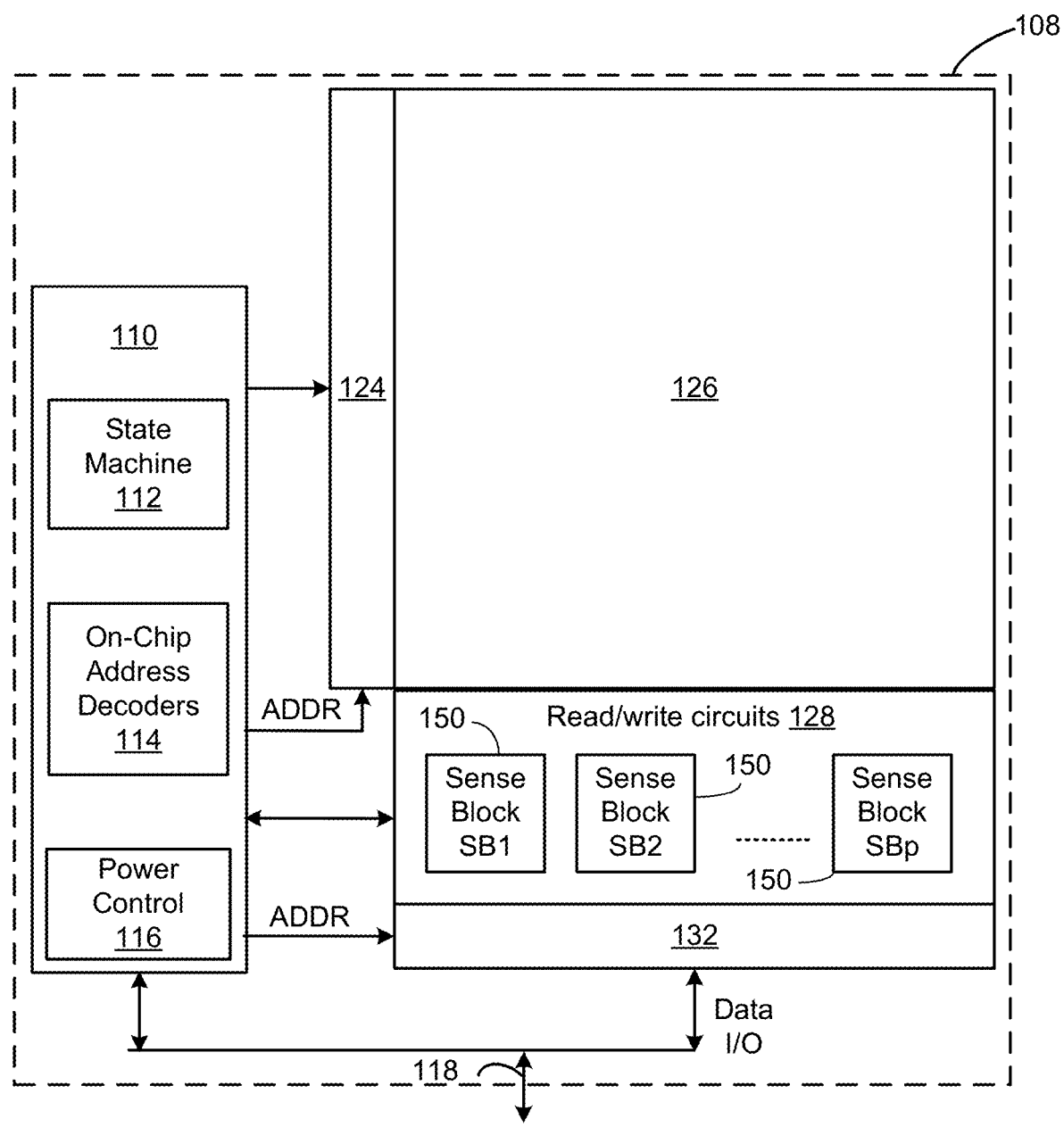
FIG. 3 is a block diagram of a non-volatile memory die.

FIG. 3 is a functional block diagram of a memory die 108. The components depicted in FIG. 3 are electrical circuits. In one embodiment, memory die 108 includes a memory structure 126 of memory cells that forms a monolithic three-dimensional memory (such as, for example, a 3D array of memory cells), control circuitry 110, and read/write circuits 128. In other embodiments, a two-dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. Commands and data are transferred between controller 22 and memory die 108 via lines 118. In one embodiment, memory die 108 includes a set of input and/or output (I/O) pins that connect to lines 118, which may form a bus that links controller 22 and memory die 108.

One embodiment of memory structure 126 comprises a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. In one embodiment, memory structure 126 implements three dimensional NAND flash memory. One example of three dimensional NAND flash memory can be found in U.S. Patent Application 2016/0300619, incorporated herein by reference in its entirety. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters. On-chip address decoder 114 provides an address interface between addresses used by host 140 or controller 22 to the hardware address used by the decoders 124 and 132. Power control module 116 controls the power and voltages supplied to the word lines and bit lines during memory operations. It can include drivers for word lines, selection transistors, source lines, and other components. Power control module 116 may include charge pumps for creating voltages. The sense blocks 150 include bit line drivers.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors that can be used within memory structure 126. A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

In one embodiment, a three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration.

One example memory system is a three-dimensional memory structure that includes vertical NAND strings with charge-trapping material. Other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 4:
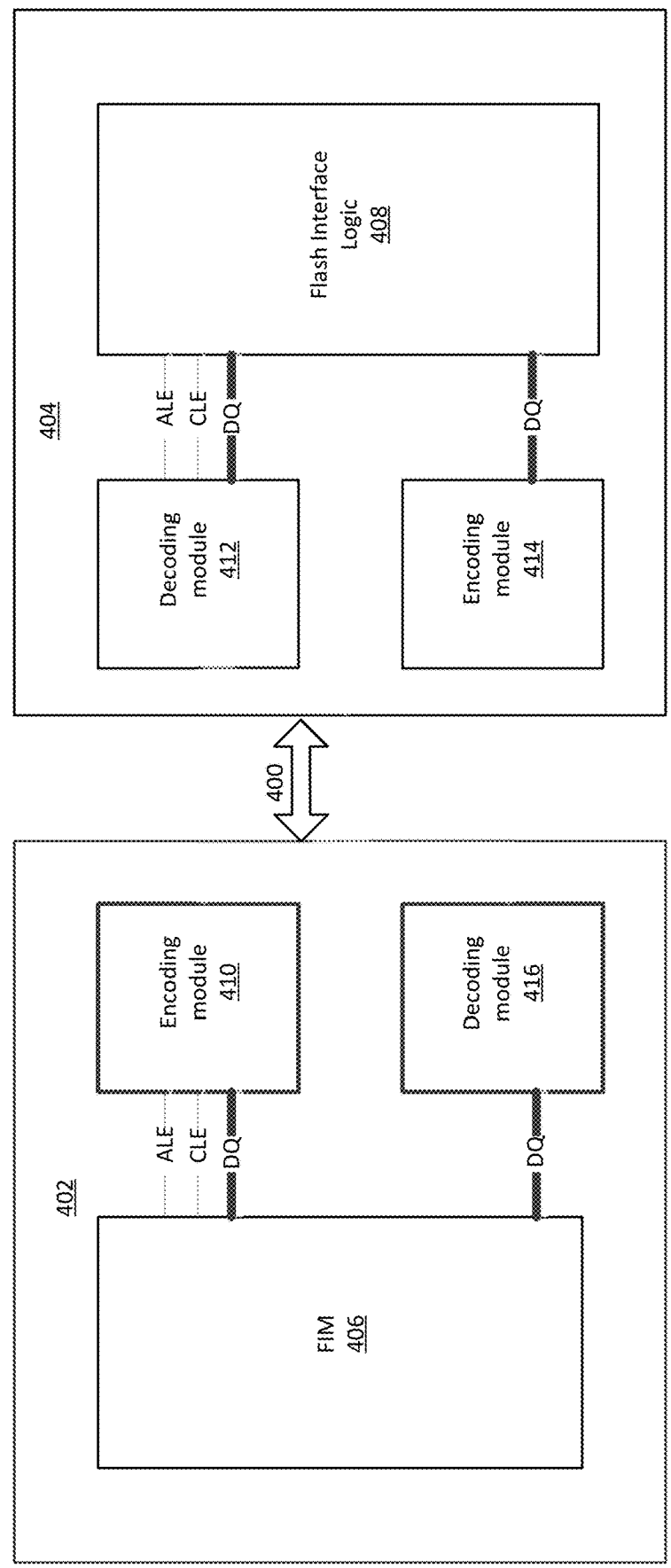
FIG. 4 shows an example of interface circuits in a memory controller and memory die connected by a bus.

FIG. 4 shows an example of a bus 400 between a memory controller 402 and a nonvolatile memory die 404 and interface circuits associated with bus 400, which may be implemented in memory interface circuits of memory controller 402 (e.g. in memory interface 230) and in control logic of nonvolatile memory die (e.g. in control circuitry 110). Bus 400 is formed of electrically conductive lines that extend from pads or pins of memory controller 402 to corresponding pads or pins of memory die 404. While bus 400 is shown extending between memory controller 402 and nonvolatile memory die 404, it will be understood that two or more nonvolatile memory dies may be connected to a memory controller using such a bus with one memory die generally being selected (selected memory die) at a time.

Memory controller 402 includes Flash Interface Module, or FIM 406, which may be, or be part of, a memory interface, such as memory interface 230. In some examples, a memory interface in a memory controller may include multiple FIMs, with each such FIM interfacing with one or more nonvolatile memory dies. Outputs from FIM 406 include an Address Latch Enable (ALE) output, a Command Latch Enable (CLE) output, and a data (DQ) output. The ALE and CLE outputs are provided on dedicated lines, which may be considered control lines, and the DQ output is provided on a set of data lines, in this example, eight data lines to provide an eight-bit (one-byte) word on the data bus. FIM 406 receives commands to access nonvolatile memory die 404 and generates appropriate outputs on ALE, CLE, and DQ outputs. For example, a command may be indicated by setting CLE output as 1, with the command data (e.g. read, write, or other command) sent as command bits on DQ output. (Additional lines that are not shown in FIG. 4 may be provided, e.g. clock line to provide a clock signal, and various power, ground, and other lines). An address may be indicated by setting ALE output as 1, with the address data (e.g. physical address in nonvolatile memory die 404) send as address bits on DQ output.

Nonvolatile memory die 404 includes flash interface logic 408 (which may be, or be part of, memory control circuitry such as control circuitry 110). Flash interface logic receives inputs ALE, CLE, and DQ and controls operations in nonvolatile memory die 404 accordingly, in conjunction with read/write circuits, column decoders, row decoders, and other components to perform memory operations (e.g., erase, program, read, and others) on a nonvolatile memory array. Rather than simply directly connecting ALE, CLE, and DQ outputs of FIM 406 to corresponding ALE, CLE, and DQ inputs of flash interface logic 408, the example of FIG. 4 shows that ALE, CLE, and DQ outputs of FIM 406 are connected to an encoding module 410 in memory controller 402. A corresponding decoding module 412 is connected to ALE, CLE, and DQ inputs of flash interface logic 408 in nonvolatile memory die 404. Encoding module 410 encodes input signals ALE, CLE and DQ and sends an encoded output on bus 400 to decoding module 412, which decodes the encoded output and regenerates ALE, CLE, and DQ signals as sent by FIM 406. Encoding and decoding in this manner facilitates several features including adaptive DBI to lower SSO noise, power consumption, and facilitates using redundancy to ensure accurate data transfer over bus 400.

Nonvolatile memory die 404 includes an encoding module 414, which is connected to receive DQ signals from flash interface logic 408 and to encode data received for sending on bus 400 to decoding module 416 in memory controller 402, which regenerates DQ signals and sends DQ signals to FIM 406. Thus, data may be encoded and decoded on both sides of bus 400 and data transferred in either direction on bus 400 may take advantage of benefits of encoding. While the schematic view of FIG. 4 shows encoding and decoding modules as separate, some components may be shared, for example, some components of encoding module 410 may be common to decoding module 416 of memory controller 402. Similarly, some components of decoding module 412 may be common to encoding module 414 of nonvolatile memory die 404.

Figures 5, 6, 7:
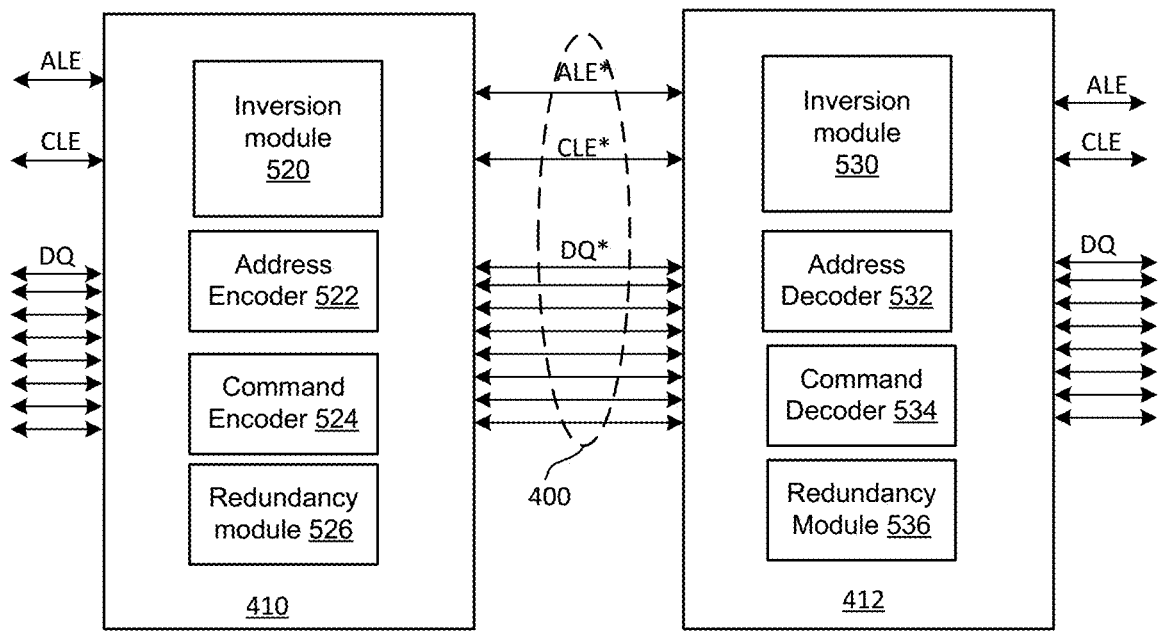
FIG. 5 shows an example of a bus with an encoder module at one end and a decoder module at another end.
FIG. 6 illustrates an example of a scheme for indicating inversion conditions using two-bit codes.
FIG. 7 illustrates an example of a scheme for indicating address and command transfers using predetermined sequences of bits.

FIG. 5 is a more detailed schematic of how certain components shown in FIG. 4 may be implemented. FIG. 5 shows encoding module 410 connected with decoding module 412 through bus 400. Encoding module 410 includes an inverter module 520, address encoder 522, command encoder 524, and redundancy module 526. Decoding module 412 includes inverter module 530, address decoder 532, command decoder 534, and redundancy module 536. Bus 400 is shown as including ten lines in this example, indicated as ALE*, CLE*, and DQ*. While these labels are similar to labels ALE, CLE, and DQ used for signals provided to encoding module 410 and signals regenerated by decoding module 412, these signals are not identical. For backward-compatibility purposes, it may be desirable to maintain some correspondence between these signals as shown. In other cases, no such correspondence may be maintained.

Aspects of the operation of certain components of FIG. 5 will now be described with reference to tables of FIGS. 6 and 7. Inverter module 520 applies an adaptive inversion routine to data received as input data signals DQ. In particular, inverter module 520 performs inversion, and partial-inversion, to generate multiple inversion options and compares the options with a prior output word sent on bus 400. An option that provides the smallest number of bit flips is selected in order to provide low SSO noise. Partial-inversion options may include inverting only some bits of a data word while not inverting other bits. For example, a first half of a data word may be inverted while a second half of a data word is not inverted. Thus, there may be two partial-inversion options in addition to the option of inverting all bits, and the option of not inverting any bits. A selected option may be applied to the data word to generate the selection which is sent with the two bits indicating the selection.

FIG. 6 illustrates an example of how adaptive inversion may be applied to an eight-bit data word and how such adaptive inversion may be indicated using a two-bit code. The two-bit code is generated by inverter module 520 and sent as output control (Output CTL) signals ALE* and CLE* with the output data (which may be inverted, not inverted, or partially-inverted) sent on DQ*. The output data sent on DQ* is shown in two columns one showing the higher four bits (higher nibble of a one-byte data word), DQ*[7:4], and the other showing the lower four bits (lower nibble), DQ* [3:0]. Original data is indicated by N, for higher four bits, and n, for lower four bits. Inverted data is indicated by for higher four bits, and ~n, for lower four bits. The first line shows the case where no inversion is performed (original data N, n provided as output on lines DQ*). This option is indicated by setting ALE* and CLE* to 1. The second line shows a first example of partial-inversion where the lower four bits are inverted (~n) while the upper four bits are not inverted (N). This option is indicated by setting ALE* to 0 and CLE* to 1. A restriction is that N may not be 1111 in this example, for reasons explained below. A selection routine may avoid choosing this option where N=1111, e.g. by choosing one of the other three options, so that the combination of ALE*=0, CLE*=1 and N=1111 is not generated. The third line shows a second example of partial-inversion where the upper four bits are inverted (~N) while the lower four bits are not inverted (n). This is indicated by setting ALE* to 1 and CLE* to 0. A restriction is that ~N may not be 1111 in this example, for reasons explained below. When ~N is 1111 one of the other options may be chosen, so that the combination of ALE*=1, CLE*=0 and N=~1111 is not generated. The last line shows the option where both the upper four bits are inverted (~N) and the lower four bits are inverted (~n). This option is indicated by setting ALE* to 0 and CLE* to 0. A restriction is that ~N may not be 1011 in this example, for reasons explained below. When ~N=1011 then this option (full inversion) may not be selected, so that the combination of ALE*=0, CLE*=0 and ~N=1011 is not generated.

Inverter module 530 receives data DQ* and the two-bit code indicating if and how the data was inverted or partially-inverted and inverts any inverted data to regenerate the original data DQ, which may then be sent for storage in nonvolatile memory. Thus, inverter module 530 uses inputs ALE* and CLE* to identify which inversion option was used on the current data word and then reverses any inversion to recover data N, n. Data N, n is then provided as an output word. It will be understood that the inversion scheme here is provided as an example and that the present technology is applicable to any suitable inversion scheme, including inversion schemes with more than four options that may be indicated by more inversion bits.

In some cases, transferring data at high speed (e.g. with a high clock speed and/or using toggle mode) may incur an elevated risk of errors. Redundancy module 526 may generate redundancy data from user data and may send the redundancy data through bus 400 to decoding module 412 where redundancy module 536 uses the redundancy data to determine if any errors have occurred during transmission of data over bus 400. For example, redundancy module 526 may apply a Cyclic Redundancy Check (CRC) scheme to user data. The same scheme, or a different scheme, may be applied to commands and addresses also. Any suitable CRC scheme may be used, e.g. CRC 16, which generates 16 bits of redundancy data from a portion of user data. 16 bits may be sent in four redundancy transfers, each transferring 4 bits of redundancy data. A reset command may reset CRC circuits to restart CRC calculation. Redundancy data is sent after the user data from which it is calculated is sent e.g. after three cycles. Redundancy data is identified to the recipient, which in this case is redundancy module 536 of decoding module 412. Redundancy module 536 calculates redundancy data from received user data and compares its calculated result with the redundancy data received from redundancy module 526 through bus 400. If the calculated and received redundancy data does not match then one or more errors are present and an exception is generated. Data may be resent in this case, or other measures may be taken to ensure that stored data is accurate. CRC may be applied to data that is transferred in either direction. For example, when a memory die sends data to a memory controller (e.g. in response to a read command) CRC calculations may be performed in the memory die and CRC redundancy data may be sent to the memory controller, which then checks the CRC redundancy data to determine if any errors occurred.

It will be understood that CRC redundancy data generated by redundancy module 526 is distinct from any ECC redundancy data that may be generated and stored with user data. CRC redundancy data is used to reduce or eliminate errors during transmission over bus 400 and is not generally stored with user data so that it is not used to detect or correct errors that may occur during storage. In general, CRC redundancy data is used to detect errors, not to correct errors. CRC redundancy data may be discarded once it is confirmed that received data does not contain errors, or does not contain errors above a threshold.

Redundancy data, command data, and address data may be sent over bus 400 with indications to a recipient to indicate what is being sent. While certain systems indicate an address using a dedicated ALE line, and indicate a command using a dedicated CLE line, examples described here indicate addresses and commands using predetermined codes (predetermined sequences of bits) that are sent on data lines (thereby facilitating the use of ALE and CLE lines for other purposes including sending data-inversion data). Redundancy data may also be indicated by a predetermined code sent on data lines.

FIG. 7 shows an example of how command data, address data, or CRC redundancy data may be identified on a bus such as bus 400. One or more predetermined codes may be provided in the higher bits of the output data DQ*[7:4]. These codes may be generated by encoding circuits such as address encoder 522, command encoder 524, and redundancy module 526. In the example of FIG. 7, the predetermined code 1111 identifies a command or address, with CLE* used to further indicate a command and ALE* used to further indicate an address. Thus, the first line (marked "Command") shows CLE* set to 1, ALE* set to 0, and DQ*[7:4] set to 1111 to indicate a command. The lower bits DQ*[3:0] contain command data, e.g. command bits indicating read or write command. This 10-bit output may be considered a command word with a subset of bits DQ*[7:4] and CLE* acting as a code identifying it as a command word and another subset of bits DQ*[3:0] being the command bits, n. Such command words may be generated by command encoder 524 when a command is received by encoding module 410 as indicated by a CLE input from a host. A transfer of such a command word is identifiable as a command transfer without reference to a prior or subsequent word.

The second line (marked "Address") shows ALE* set to 1, CLE* set to 0, and DQ*[7:4] set to 1111 to indicate an address. The lower bits DQ*[3:0] contain the address data, e.g. address bits indicating a physical location in a memory array that is to be accessed. This 10-bit output may be considered an address word with a subset of bits DQ*[7:4] and ALE* acting as a code identifying it as an address word and another subset of bits DQ*[3:0] being the address bits, n. Such address words may be generated by address encoder 522 when an address is received by encoding module 410 as indicated by an ALE input from a host. A transfer of such an address word is identifiable as an address transfer without reference to a prior or subsequent word.

The third line (marked "CRC") shows ALE* and CLE* set to 0 and DQ*[7:4] set to 1011 to indicate CRC data. The lower bits DQ*[3:0] contain the redundancy data, e.g. CRC bits calculated over some range of user data. This 10-bit output may be considered a redundancy word with a subset of bits, DQ*[7:4], ALE* and CLE*, acting as a code identifying it as a redundancy word and another subset of bits DQ*[3:0] being redundancy bits, n. CRC bits and identifying code may be generated by redundancy module 526 as appropriate, for example, for all data, or when specific conditions occur (e.g. high speed, high error rate, high number of errors found, sensitive data being sent, or in response to a host command). A transfer of such a redundancy word is identifiable as a redundancy transfer without reference to a prior or subsequent word.

The last line (marked "Data") indicates that any other combination of output bits indicates user data, with ALE* and CLE* being the data-inversion data associated with user data sent on DQ* lines, i.e. all other combinations are reflected in FIG. 6, which shows the user data inversion options and their corresponding two-bit codes. Thus, any given 10-bit word in the scheme of FIG. 7 contains sufficient identifying information to be identifiable as a command word, address word, redundancy word, or user data word without referring to any information outside the 10-bit word.

As discussed above with respect to the restrictions listed in FIG. 6, three combinations are prohibited as output bits for user data transfer (ALE*=0 and CLE*=1, or ALE*=1 and CLE*=0, with upper bits=1111, and ALE*=0, CLE*=0 and upper bits=1011) so that these three combinations are reserved exclusively to indicate a command transfer, an address transfer, and a redundancy transfer. Different combinations may be reserved and the codes used may be arbitrarily chosen. The examples of described here are for illustration and it will be understood that different implementation may use different codes encoded in different ways. While the scheme of FIGS. 6-7 includes restrictions on encoding user data, it will be understood that restrictions will be encountered infrequently and that when they are encountered a next-best option may be selected, often with little impact on overall SSO noise.

Figure 8:
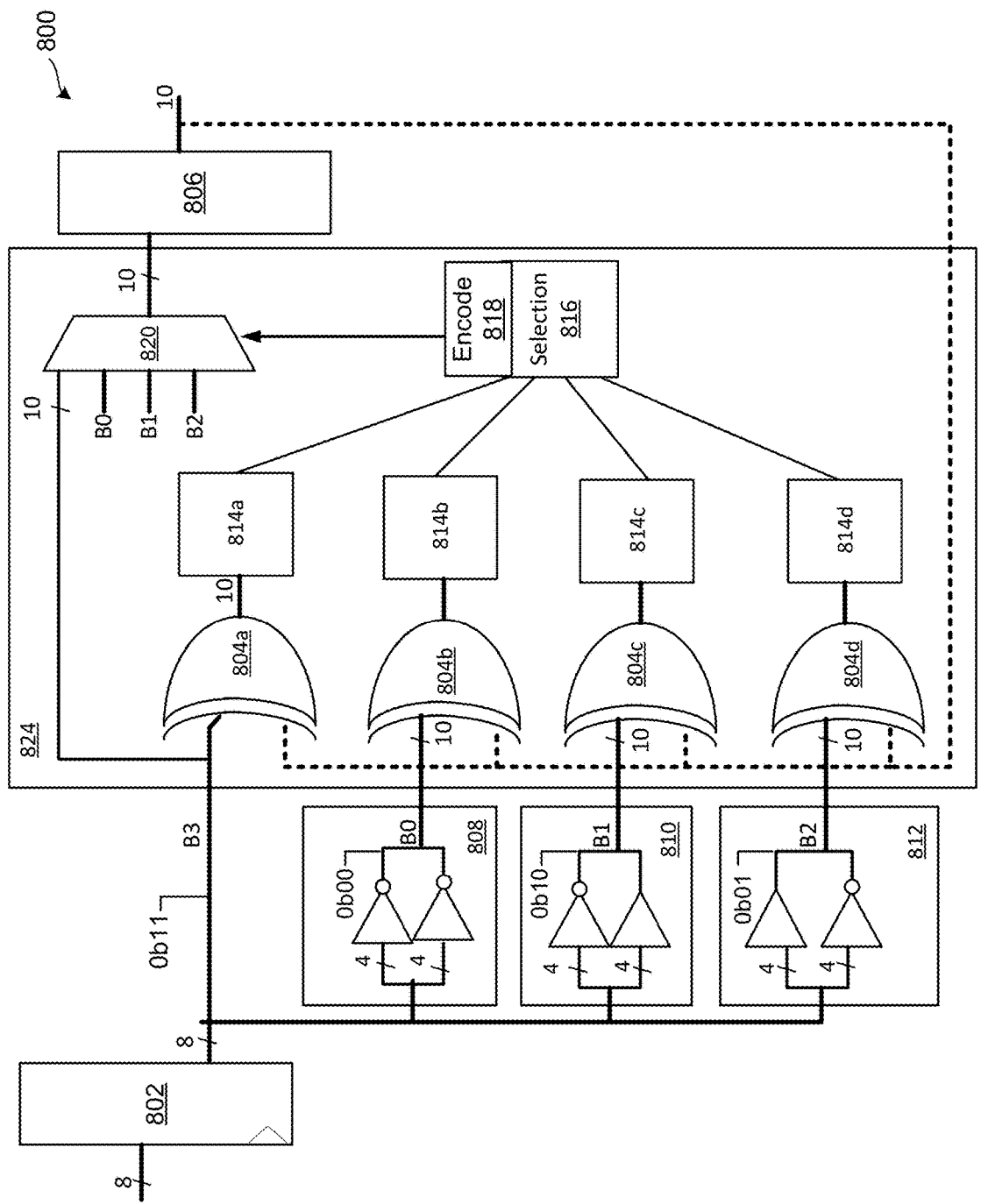
FIG. 8 illustrates an example of an encoder circuit.

FIG. 8 illustrates an example of an adaptive inversion module 800 that may be used in an inverter module such as inverter module 520 and may implement an adaptive inversion scheme such as shown in FIG. 6. Adaptive inversion module 800 includes a data input circuit 802 that receives an input (e.g. one-byte wide data input such as DQ) and generates an 8-bit wide output. Data input circuit 802 may include one or more buffers to facilitate smooth transfer of data. The output of data input circuit 802 is sent to a first Exclusive OR (XOR) circuit, XOR 804a, with two additional bits 1, 1 ("0b11") to form a ten-bit wide input (B3) to XOR 804a. The additional two bits are a two-bit code associated with a data word that is not inverted, or partially-inverted, and is concatenated with the 8-bit output of data input circuit 802, which corresponds to the received data without inversion or partial inversion. The other input to XOR 804a (shown by dashed line) is received from data output circuit 806 and corresponds to the prior data word output by data output circuit 806, including 8 user data bits and a two-bit code to indicate an inversion condition (e.g. to indicate inverted, not inverted, higher bits only inverted, or lower bits only inverted). Thus, XOR 804a performs an exclusive OR operation on the ten bits of the prior output compared with the ten bits of the present word, including the two-bit code that indicates no inversion. An XOR operation provides an output logic 1 for any bit that changes between the prior word and the current word so that the output of XOR 804a includes a number of logic 1 bits that is the number of flipped bits that would occur if the current data word was sent without inversion or partial-inversion.

The output of data input circuit 802 is also sent to an inversion circuit 808, where it is separated into two 4-bit inputs to two inverters so that both upper bits and lower bits of the 8-bit data word are separately inverted (a single 8-bit inverter or other means for inverting a data word may alternatively be used). The inverted bits are then recombined into an 8-bit output that is the inverse of the output of data input circuit 802. The two-bit code corresponding to inversion of both upper bits and lower bits 0, 0 ("0b00") is concatenated with the inverted data and is sent as a 10-bit input (B0) to XOR 804b. Concatenation of code bits may be performed at any time and may be implemented in a pipelined fashion. Similarly, decoding may be performed in a pipelined fashion so that these steps do not have to be performed by logic running at the line rate. The other input of XOR 804b is received from data output circuit 806 and corresponds to the prior data word output by data output circuit 806, including 8 user data bits and a two-bit code (this is the same input provided to XOR 804a). Thus, XOR 804b performs an exclusive OR operation on the ten bits of the prior output compared with the ten bits of the inverted current word, including the two-bit code that indicates inversion. The output of XOR 804b includes a number of logic 1 bits that is the number of flipped bits that would occur if the current data word was inverted.

The output of data input circuit 802 is also sent to a partial-inversion circuit 810, where it is separated into two 4-bit inputs, one of which is provided to an inverter, so that only upper four bits are inverted while the lower four remain the same (any other suitable partial-inversion means may alternatively be used). The inverted four bits and the uninverted four bits are then recombined into an 8-bit output. The two-bit code corresponding to inversion of upper bits only 1, 0 ("0b10") is concatenated with the partially-inverted data and is sent as a 10-bit input, B1, to XOR 804c. The other input of XOR 804c is received from data output circuit 806 and corresponds to the prior data word output by data output circuit 806, including 8 user data bits and a two-bit code (this is the same input provided to XOR 804a and XOR 804b). Thus, XOR 804c performs an exclusive OR operation on the ten bits of the prior output compared with the ten bits of a partially-inverted present word, with upper bits inverted and lower bits not inverted, including the two-bit code that indicates this partial-inversion condition. The output of XOR 804c includes a number of logic 1 bits that is the number of flipped bits that would occur if only upper bits of the present word were inverted.

The output of data input circuit 802 is also sent to a partial-inversion circuit 812, where it is separated into two 4-bit inputs, one of which is provided to an inverter, so that only the lower four bits are inverted while upper four bits remain the same (any other suitable partial-inversion means may alternatively be used). The inverted four bits and the uninverted four bits are then recombined into an 8-bit output. The two-bit code corresponding to inversion of lower bits only 0, 1 ("0b01") is concatenated with the partially-inverted data and is sent as a 10-bit input, B2, to XOR 804d. The other input of XOR 804d is received from data output circuit 806 and corresponds to the prior data word output by data output circuit 806, including 8 user data bits and a two-bit code (this is the same input provided to XOR 804a, XOR 804b, and XOR 804c). Thus, XOR 804d performs an exclusive OR operation on the ten bits of the prior output compared with the ten bits of a partially-inverted present word, with lower bits inverted and upper bits not inverted, including the two-bit code that indicates this partial-inversion condition. The output of XOR 804d includes a number of logic 1 bits that is the number of flipped bits that would occur if only upper bits of the present word were inverted.

Exclusive OR gates, XORs 804a-d provide outputs containing numbers of logic 1 bits that reflect the number of bits that would be flipped according to different inversion options including not inverting, inverting, inverting only upper bits, and inverting only lower bits. Counters 814a-d are connected to outputs of XORs 804a-d respectively to count the numbers of logic 1 bits for each of these options. Counter 814a is connected to the output of XOR 804a to count the number of logic 1 bits generated by an exclusive OR operation applied to uninverted data and the prior output word. Counter 814b is connected to the output of XOR 804b to count the number of logic 1 bits generated by an exclusive OR operation applied to inverted data and the prior output word. Counter 814c is connected to the output of XOR 804c to count the number of logic 1 bits generated by an exclusive OR operation applied to data with only upper bits inverted and a prior output word. Counter 814d is connected to the output of XOR 804d to count the number of logic 1 bits generated by an exclusive OR operation applied to data with only lower bits inverted and a prior output word. A selection circuit 816 receives inputs from counters 814a-d and selects the option with the fewest 1 bits (i.e. the inversion option that would result in fewest flipped bits). Selection circuit 816 may perform a comparison operation on numbers received from counters 814a-d to identify the lowest number, which corresponds to the inversion option that produces the fewest flipped bits.

In an alternative example, instead of using the prior data word as a reference data word for comparison, a predetermined data word may be used (e.g. a predetermined series of bits such as 0000000000, or 1111111111). This may be used to select an option that produces the fewest 0s or fewest 1s in the output word. For example, in some cases, it may be desirable to reduce the number of outputs to the bus that provide a high voltage rather than a low voltage (e.g. it may be preferable to maximize the number of outputs that are at 0 volts) to thereby reduce power consumption. Thus, where a logic 1 bit is represented by applying 0 volts on a corresponding output, it may be desirable to maximize the number of 1s and minimize the number of 0s. XORs 804a-d may be provided with a corresponding constant value 1111111111 so that they generate outputs to counters 814a-d, which indicate the numbers of logic 0 bits for the different options. Selection circuit 816 then performs a comparison operation on numbers received from counters 814a-d to identify the lowest number, which corresponds to the inversion option that produces the fewest logic 0 bits.

An encoding circuit 818 generates a two-bit code according to the option identified by selection circuit 816. Encoding circuit 818 sends the two-bit code to multiplexer 820 as a selection input that determines which of inputs B0-B3 is selected. Inputs B0-B3 were previously discussed (lines providing inputs B0-B2 to multiplexer 820 are not shown in-full for clarity). Inputs B0-B3 reflect four different options for sending data, including inverting all bits (B0), inverting only upper bits (B1), inverting only lower bits (B2), and not inverting any bits (B3). Input from encoding circuit 818 selects one of these options according to the option identified by selection circuit 816 as causing fewest flipped bits. This option is then provided as 10-bit output from multiplexer 820 to data output circuit 806, where it may be transferred to a bus. Data output circuit 806 also provides the 10-bit output as a comparison for a subsequent data word. XORs 804a-d, counters 814a-d, selection circuit 816, encoding circuit 818 and multiplexer 820 form a comparison and selection circuit 824 that compares inversion options and selects an option that provides fewest flipped bits. While comparison and selection circuit 824 is used in this example, any other suitable means for comparing and selecting between options may be used.

Figure 9:
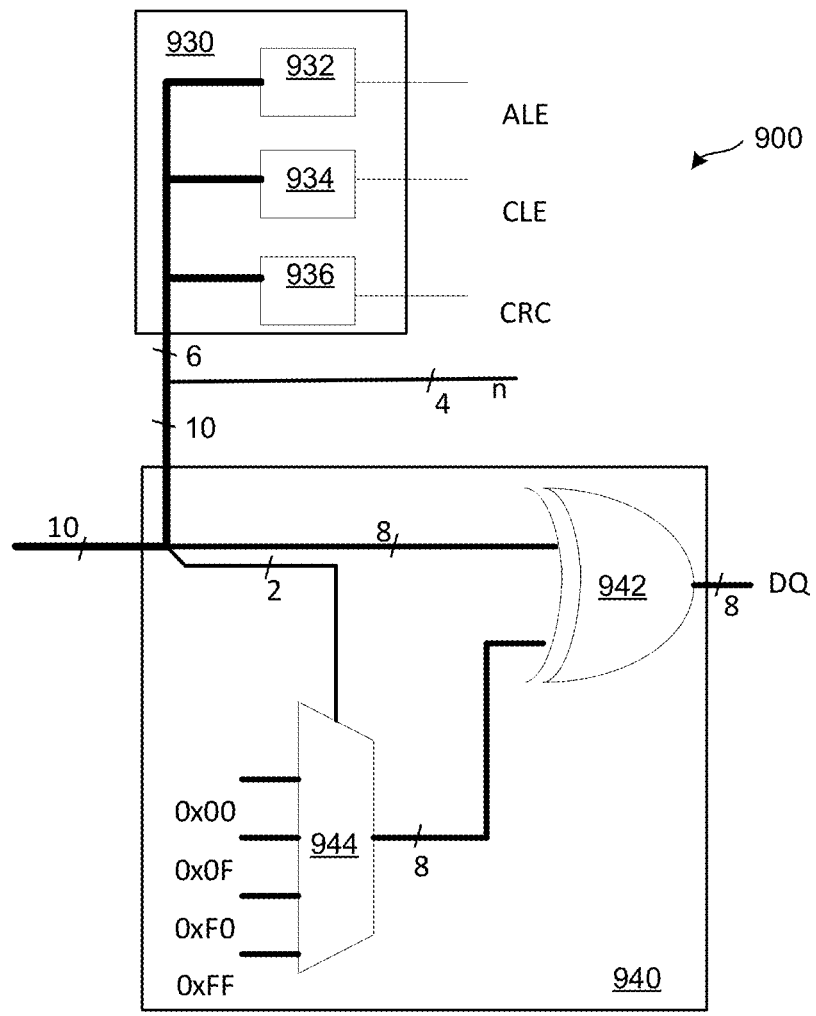
FIG. 9 illustrates an example of a decoder circuit.

FIG. 9 shows an example of an adaptive decoding module 900 that may decode data encoded with adaptive inversion, for example, using a scheme as illustrated in FIGS. 6-7. For example, adaptive decoding module 900 may be implemented in a decoding module such as decoding module 412 of FIG. 5 to decode data that was encoded using adaptive inversion. Adaptive decoding module 900 receives a 10-bit input (e.g. through a bus with 10 electrically conductive leads such as bus 400) and includes a control-data detection module 930 that detects when control-data such as address data, command data, or redundancy data is received. Control-data detection module 930 looks for specific codes that indicate an address, command, redundancy, or other control data. For example, control-data detection module 930 may look for codes indicated in FIG. 7. As indicated in FIG. 7, these codes are provided as predetermined sequences of bits on specific lines of a bus, e.g. ALE*=0 and CLE*=1, or ALE*=1 and CLE*=0, and upper bits=1111, and ALE*=0, CLE*=0 and upper bits=1011. Because these codes are provided on six specific lines in this example, these lines (ALE*, CLE*, and upper bits DQ*[7:4]) are provided as a 6-bit input to control-data detection module 930. Other schemes may use different codes and may detect codes differently.

An address decoder 932 detects when a predetermined sequence of bits indicates an address (e.g. when ALE*=1, CLE*=0, and DQ*[7:4]=1111). When this sequence of bits is detected by address decoder 932, it generates an output on a single line, ALE. This signal is the same as a single-line ALE input received by an encoder at the input side of the bus (e.g. received by encoding module 410 of FIG. 5) so that the ALE signal is restored to a single-line signal. The ALE signal is output to enable address latching. Lower bits n (DQ*[3:0]), which contain address data, are also provided to an address latch (not shown) where an address may be assembled by latching two or more transfers of 4-bits each.

A command decoder 934 detects when a predetermined sequence of bits indicates a command (e.g. when ALE*=0, CLE*=1, and DQ*[7:4]=1111 in the example of FIG. 7). When this sequence of bits is detected by command decoder 934, it generates an output on a single line, CLE. This signal is the same as a single-line CLE input received by an encoder at the input side of the bus (e.g. received by encoding module 410 in FIG. 5) so that the CLE signal is restored to a single-line signal. The CLE signal is output to enable latching and execution of the command. Lower bits n (DQ*[3:0]), which contain command data, are also provided to a command latch (not shown) where a command may be assembled by latching two or more transfers of 4-bits each.

A redundancy decoder 936 detects when a predetermined sequence of bits indicates redundancy data (e.g. when ALE*=0, CLE*=0, and DQ*[7:4]=1011 in the example of FIG. 7). When this sequence of bits is detected by redundancy decoder 936, it generates an output on a line, CRC. This signal may enable a redundancy circuit (not shown). Lower bits n, (DQ*[3:0]), which contain redundancy data, are also provided to a redundancy circuit where received redundancy data may be compared with redundancy data calculated from received user data to identify errors in the received data.

FIG. 9 also shows inversion module 940, which receives a 10-bit input and generates an 8-bit output, DQ, that is the same data as received by an encoder at the input end of a data bus (e.g. same as DQ received by encoding module 410 of FIG. 5). Thus, inversion module 940 generally transforms data in a manner that is opposite to that performed by adaptive inversion module 800. In inversion module 940, eight bits of the 10-bit input are provided to an XOR 942. Specifically, in the present example, bits corresponding to output data DQ*[7:0] are provided to XOR 942. Two bits are provided as a select input to multiplexer 944. Specifically, in the present example, bits corresponding to ALE* and CLE* are provided to select an output from multiplexer 944 that is provided as a second input to XOR 942.

The output from multiplexer 944 is selected from four 8-bit inputs that provide four different inversion options when an XOR operation combines them with data DQ*[7:0]. Specifically, a first input is 0x00 in hexadecimal (i.e. 00000000 in binary). This option is selected when ALE*=1 and CLE*=1, indicating that the received data (DQ*[7:0]) is not inverted (see first line FIG. 6). When XOR 942 performs an XOR operation with DQ*[7:0] and 0x00, this returns DQ*[7:0] as the output DQ (i.e. there is no inversion or partial-inversion of any data bits of DQ*[7:0].

A second input is 0x0F in hexadecimal (i.e. 00001111 in binary). This option is selected when ALE*=0 and CLE*=1, indicating that upper bits (DQ*[7:4]) are not inverted and lower bits DQ*[3:0] are inverted (see second line in FIG. 6). When XOR 942 performs an XOR operation with DQ*[7:0] and 0x0F, this inverts lower bits DQ*[3:0] and does not invert upper bits DQ*[7:4] thus reversing inversion performed by an encoder such as encoding module 410.

A third input is 0xF0 in hexadecimal (i.e. 11110000 in binary). This option is selected when ALE*=1 and CLE*=0, indicating that upper bits (DQ*[7:4]) are inverted and lower bits DQ*[3:0] are not inverted (see third line in FIG. 6). When XOR 942 performs an XOR operation with DQ*[7:0] and 0xF0, this inverts upper bits DQ*[7:4] and does not invert lower bits DQ*[3:0] thus reversing inversion performed by an encoder such as encoding module 410.

A fourth input is 0xFF in hexadecimal (i.e. 11111111 in binary). This option is selected when ALE*=0 and CLE*=0, indicating that upper bits (DQ*[7:4]) and lower bits DQ*[3:0] are inverted (see fourth line in FIG. 6). When XOR 942 performs an XOR operation with DQ*[7:0] and 0xFF, this inverts upper bits DQ*[7:4] and lower bits DQ*[3:0] thus reversing inversion performed by an encoder such as encoding module 410.

While the examples discussed above refer to data being encoded at one side of a bus and decoded at another side of the bus, it will be understood that encoding and decoding may both be performed at each side so that data is encoded prior to being sent in either direction. For example, in addition to encoding data in a memory controller prior to sending the data on a bus to a memory die, data may be encoded in a memory die prior to sending the data on the bus to the memory controller. Encoding and decoding may be performed in a pipelined fashion by encoding and decoding stages at either end of a bus. The same encoding scheme may be used in both directions, e.g. using adaptive inversion in both directions. Encoding and decoding circuits may be provided at both ends of a bus. For example, FIG. 4 shows that memory controller 402 contains decoding module 416 in addition to encoding module 410 and that memory die 404 contains encoding module 414 in addition to decoding module 412. Encoding module 414 may generally operate similarly to encoding module 410. Encoding module does not receive ALE or CLE inputs because these inputs are not generally generated on a memory die. Thus, encoding module 414 may not include an address encoder or command encoder. Correspondingly, decoding module 416 may not include an address decoder or command decoder and the possible outputs from encoding module 414 may not include codes corresponding to ALE and CLE inputs (i.e. outputs corresponding to first two lines of FIG. 7 may not be used). User data may be inverted as described above, and redundancy data may be encoded as described above, and the encoded data may be conveyed on the 10-bit bus as described.

The benefits of using an adaptive inversion scheme may be significant. FIG. 10 illustrates some advantages that are achievable using aspects of adaptive inversion, including reducing the average numbers of transitions (bit flips) and reducing power. The first line illustrates 8-bit data without any inversion ("8-bit data only"). The average number of transitions, or bit flips ("Ave Flip") is 4.08, about half of the number of bits (i.e. average is about four of eight bits). The maximum number of transitions or flips ("Max Flips") is equal to the total number of bits, i.e. eight bits. The current used is 49.62 mA of root mean squared power ("Rms pwr"). The next line illustrates 10-bit data without any inversion ("10-bit code"). The average number of transitions is 5.13, which is about half of the total number of bits (i.e. average is about five of ten bits). The maximum number of transitions is nine in this example (assuming that both control lines do not change together) The power used in this case is 62.43 mA. The next line ("inv only") illustrates an example of 10-bits with only a single inversion option (i.e. data is either inverted, or not inverted, with no partial-inversion option). This provides an average of 3.70 transitions or flips and a maximum of 5. This is a reduction in the average number of transitions of 1.43 transitions compared with the previous line (column marked "Flip diff" indicates difference in the average number of flipped bits with respect to the previous line). The power used in this example is 45.01 mA, which represents a reduction of 9% compared with the 8-bit example in the first line (column marked "PWR diff" indicates the difference in RMS power compared with alternative). The next line illustrates an example of 10-bits using four inversion options and including two control bits ("4 opts with ctrl"). The inversion options are: invert all 8 bits, invert no bits, invert first 4 bits, and invert second 4 bits. This adaptive inversion scheme reduces the average number of transitions to 3.13, with a maximum of 5 transitions. This represents a reduction in the average number of transitions of 0.57 transitions compared with the previous line and uses 38.06 mA of power, which represents 23% less power than the first line. The last line illustrates an example of 10-bits using four inversion options and considering control bits when selecting an inversion option (i.e. considering transitions across 10 bits instead of only 8 bits). In this case, the average number of flipped bits is 3.08, with a maximum of four. This represents a reduction in the average number of transitions of 0.04. Power use is 37.54 mA, which is 24% less than the first line. Thus, it can be seen that adaptive inversion has significant advantages over alternatives, providing fewer flipped bits (and thus lower SSO noise) and using less power. Thus, for a given power budget, adaptive inversion may allow operation at higher speeds. While advantages are described with respect to an 8-bit or 10-bit bus, it will be understood that advantages may be obtained for other arrangements including busses of different sizes, e.g. using n-bit data word, where n may be less than 8, or more than 10, such as 16-bit, 32-bit, or more).

Figure 11:
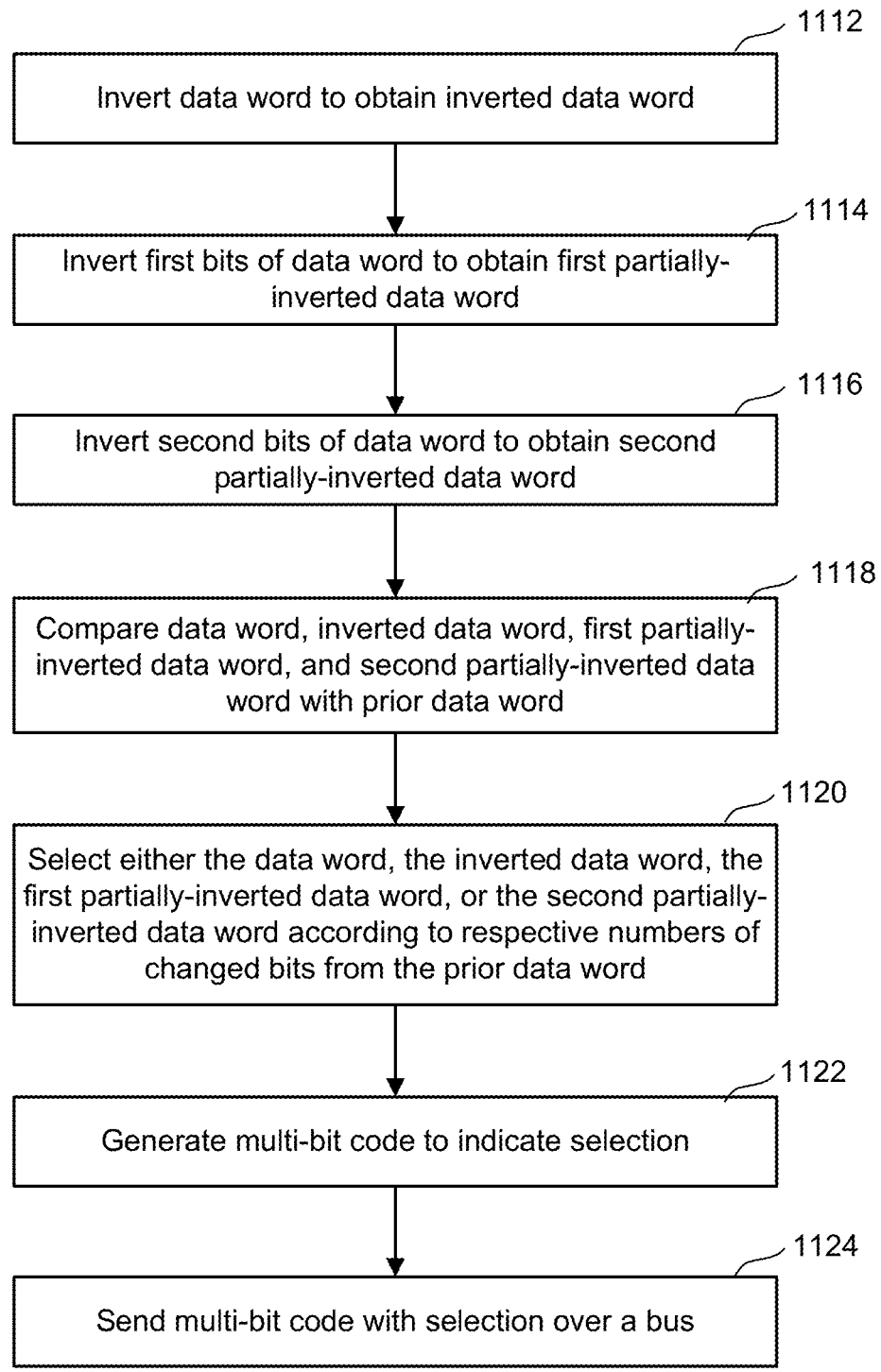
FIG. 11 illustrates a method of encoding data with adaptive inversion.

FIG. 11 illustrates a method of operating a bus, e.g. a bus between a memory controller and a memory die. A data word is received and the data word is inverted to obtain the inverted data word 1112. The first bits of the data word are inverted without inverting the second bits of the data word to obtain a first partially-inverted data word 1114. The second bits of the data word are inverted without inverting the first bits of the data word to obtain a second partially-inverted data word 1116. The data word, inverted data word, first partially-inverted data word, and second partially-inverted data word are compared with a prior data word 1118. Either the data word, the inverted data word, the first partially-inverted data word, or the second partially-inverted data word is selected according to respective numbers of changed bits from the prior data word 1120. A multi-bit code is generated to indicate this selection 1122. The multi-bit code is sent with the selection over a bus 1124.

The technology described herein uses adaptive inversion to provide power-efficient, low-noise, operation, including at high speeds. Aspects of the technology are applicable to various busses, including between a memory controller and memory dies.

One embodiment includes an apparatus comprising an inversion circuit configured to invert a data word; a first partial-inversion circuit configured to invert a first portion of the data word; a second partial-inversion circuit configured to invert a second portion of the data word; and an output selection circuit configured to compare: the data word, an output of the inversion circuit, an output of the first partial-inversion circuit, and an output of the second partial-inversion circuit with a prior data word, and to select an output from the data word, the output of the inversion circuit, the output of the first partial-inversion circuit, and the output of the second partial-inversion circuit according to respective numbers of changed bits from the prior data word.

In one example implementation, the data word is a one-byte data word, the first partial-inversion circuit is configured to invert a first four bits of the data word and the second partial-inversion circuit is configured to invert a second four bits of the data word.

In one example implementation, the apparatus further comprises an output encoding circuit connected to the output selection circuit to generate a two-bit code according to the output of the output selection circuit.

In one example implementation, the apparatus further comprises a command encoding circuit configured to generate an output word that includes a plurality of command bits and a predetermined plurality of bits signifying the output word includes command bits.

In one example implementation, the apparatus further comprises an address encoding circuit configured to generate an output word that includes a plurality of address bits and a predetermined plurality of bits signifying the output word includes address bits.

In one example implementation, the apparatus further comprises a redundancy circuit configured to calculate redundancy data for at least one of: user data, command data, and address data, the redundancy data forming a first portion of a redundancy word, a second portion of the redundancy word formed by a predetermined series of bits that signify a redundancy word.

In one example implementation, the inversion circuit, the first partial-inversion circuit, the second partial-inversion circuit, and the output selection circuit are formed in a memory controller.

In one example implementation, the apparatus further comprises a bus extending between the memory controller and one or more memory dies, the bus configured to receive an output from the output selection circuit and to send the output to a selected memory die.

One embodiment includes a system comprising: a memory controller; a memory die; a bus extending from the memory controller to the memory die, the bus comprising:

a first plurality of electrical conductors configured to convey a portion of user data in a data transfer; a second plurality of electrical conductors configured to convey data-inversion data associated with the portion of user data in the data transfer; a first subset of the first plurality of electrical conductors configured to convey a predetermined code in a command transfer; and the second plurality of electrical conductors configured to convey one or more control signals in the command transfer.

In one example implementation, the first subset of the first plurality of electrical conductors are configured to convey the predetermined code in an address transfer; and the second plurality of electrical conductors are configured to convey one or more control signals in the address transfer.

In one example implementation, the second plurality of electrical conductors is configured to convey at least two data-inversion bits to identify conditions including inverted and partially-inverted in the data transfer, and wherein the second plurality of electrical conductors includes a first electrical conductor to convey a command signal in a command transfer and a second electrical conductor to convey an address signal in an address transfer.

In one example implementation, the second plurality of electrical conductors includes at least two electrical conductors to convey at least two data-inversion bits to identify conditions including inverted, not-inverted, first n/2 bits inverted, and second n/2 bits inverted in the data transfer.

In one example implementation, the system includes means for inverting first n/2 bits of an n-bit data word and means for inverting second n/2 bits of the n-bit data word.

In one example implementation, the system includes means for comparing data, inverted data, and partially-inverted data with prior data.

In one example implementation, the system includes a redundancy circuit in the memory controller, the redundancy circuit configured to calculate redundancy data and send the redundancy data in a redundancy transfer while the first subset of the first plurality of electrical conductors identify a redundancy transfer.

One embodiment includes a method comprising: inverting a data word to obtain an inverted data word; inverting first bits of the data word to obtain a first partially-inverted data word; inverting second bits of the data word to obtain a second partially-inverted data word; comparing the data word, the inverted data word, the first partially-inverted data word, and the second partially-inverted data word with a reference data word; and selecting either the data word, the inverted data word, the first partially-inverted data word, or the second partially-inverted data word according to respective numbers of changed bits from the reference data word.

In one example implementation, the method includes generating a multi-bit code to indicate a selection from the data word, the inverted data word, the first partially-inverted data word, and the second partially-inverted data word, and sending the multi-bit code with the selection over a bus.

In one example implementation, the method includes sending the selection on a first plurality of electrical conductors of the bus, while sending the multi-bit code on a second plurality of electrical conductors of the bus in a data transfer; and sending a predetermined identifying sequence of bits on a first subset of the first plurality of electrical conductors of the bus, while sending command data on a second subset of the first plurality of electrical conductors of the bus in a command transfer.

In one example implementation, the method includes sending the selection on a first plurality of electrical conductors of the bus, while sending the multi-bit code on a second plurality of electrical conductors of the bus in a data transfer; and sending a predetermined identifying sequence of bits on a first subset of the first plurality of electrical conductors of the bus while sending address data on a second subset of the first plurality of electrical conductors of the bus in an address transfer.

In one example implementation, the method includes sending the selection on a first plurality of electrical conductors of the bus, while sending the multi-bit code on a second plurality of electrical conductors of the bus in a data transfer; and sending a predetermined identifying sequence of bits on a first subset of the first plurality of electrical conductors of the bus while sending redundancy data on a second subset of the first plurality of electrical conductors of the bus in a redundancy transfer.

In one example, the reference data word is a prior data word.

In one example, the reference data word is a predetermined data word.

One embodiment includes an apparatus comprising: means for inverting a data word; a first partial-inversion means for inverting a first portion of the data word; a second partial-inversion means for inverting a second portion of the data word; and an output selection means for comparing: the data word, an output of the means for inverting, an output of the first partial-inversion means, and an output of the second partial-inversion means with a prior data word, and for selecting an output from the data word, the output of the means for inverting, the output of the first partial-inversion means, and the output of the second partial-inversion means according to respective numbers of changed bits from the prior data word.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
an inversion circuit configured to invert a data word;
a first partial-inversion circuit configured to invert a first portion of the data word;
a second partial-inversion circuit configured to invert a second portion of the data word;
an output selection circuit configured to compare: the data word, an output of the inversion circuit, an output of the first partial-inversion circuit, and an output of the second partial-inversion circuit with a prior data word, and to select an output from the data word, the output of the inversion circuit, the output of the first partial-inversion circuit, and the output of the second partial-inversion circuit according to respective numbers of changed bits from the prior data word;
an output encoding circuit connected to the output selection circuit to generate a two-bit inversion code according to the output of the output selection circuit;
a command encoding circuit configured to generate an output word that includes a plurality of command bits and the output word includes a predetermined plurality of bits signifying that the output word includes command bits;
a plurality of bus elements including an address latch enable (ALE) bus element, a command latch enable (CLE) bus element, and a plurality of data bus elements, the plurality of data bus elements configured to send the selected output of the output selection circuit and the ALE and CLE bus elements configured to send the two-bit inversion code indicating an inversion condition of the selected output to a selected memory die in a data transfer; and
the CLE bus element configured to send a CLE signal and the plurality of data bus elements configured to send the plurality of command bits and the predetermined plurality of bits to the selected memory die in a command transfer.

2. The apparatus of claim 1 wherein the data word is a one-byte data word, the first partial-inversion circuit is configured to invert a first four bits of the data word and the second partial-inversion circuit is configured to invert a second four bits of the data word.

3. The apparatus of claim 1 wherein the plurality of bus elements are coupled to decoding circuits of a memory die.

4. The apparatus of claim 1 wherein the plurality of bus elements consists of 10 elements, the selected output of the output selection circuit consists of 8 bits, and the predetermined plurality of bits includes 4 or more bits.

5. The apparatus of claim 1 further comprising an address encoding circuit configured to generate an output word that includes a plurality of address bits and a predetermined plurality of bits signifying the output word includes address bits, the plurality of data bus elements configured to send the plurality of address bits and the predetermined plurality of bits in a data transfer.

6. The apparatus of claim 1 further comprising a redundancy circuit configured to calculate redundancy data for at least one of: user data, command data, and address data, the redundancy data forming a first portion of a redundancy word, a second portion of the redundancy word formed by a predetermined series of bits that signify a redundancy word.

7. The apparatus of claim 1 wherein the inversion circuit, the first partial-inversion circuit, the second partial-inversion circuit, and the output selection circuit are formed in a memory controller.

8. The apparatus of claim 7 wherein the plurality of bus elements form a bus extending between the memory controller and one or more memory dies, the bus configured to receive an output from the output selection circuit and to send the output to the selected memory die.

9. A system comprising:
an encoding module in a memory controller, the encoding module configured to receive data on a plurality of data lines and to receive one or more control signals on dedicated control lines, the encoding module configured to generate data-inversion data for a portion of the data received on the plurality of data lines;
a memory die;
a bus extending from the memory controller to the memory die, the bus comprising:
a first plurality of electrical conductors configured to convey the portion of user data in a data transfer;
a second plurality of electrical conductors configured to convey the data-inversion data associated with the portion of user data in the data transfer;
a first subset of the first plurality of electrical conductors configured to convey a predetermined code in a command transfer such that an individual electrical conductor of the first subset is configured to convey user data in the data transfer and predetermined code in the command transfer; and
the second plurality of electrical conductors configured to convey the one or more control signals in the command transfer, the one or more control signals include a Command Latch Enable (CLE) signal and an Address Latch Enable (ALE) signal, the second plurality of electrical conductors include a first electrical conductor to convey the CLE signal in the command transfer and a second electrical conductor to convey the ALE signal in an address transfer.

10. The system of claim 9 wherein the first subset of the first plurality of electrical conductors are configured to convey the predetermined code in an address transfer; and
the second plurality of electrical conductors are configured to convey one or more control signals in the address transfer.

11. The system of claim 10 wherein the second subset of the first plurality of electrical conductors is configured to convey address bits in the address transfer.

12. The system of claim 9 further comprising a decoding module in the memory die, the decoding module configured to receive the portion of user data and the data-inversion data in a data transfer and receive the predetermined code and the one or more control signals in a command transfer, the decoding module configured to regenerate the portion of data and the one or more control signals as received by the encoding module.

13. The system of claim 9 further comprising a redundancy circuit in the memory controller, the redundancy circuit configured to calculate redundancy data and send the redundancy data in a redundancy transfer while the first subset of the first plurality of electrical conductors identify a redundancy transfer.

14. A method comprising:
inverting a data word to obtain an inverted data word;
inverting first bits of the data word to obtain a first partially-inverted data word;

inverting second bits of the data word to obtain a second partially-inverted data word;

comparing the data word, the inverted data word, the first partially-inverted data word, and the second partially-inverted data word with a reference data word;

selecting either the data word, the inverted data word, the first partially-inverted data word, or the second partially-inverted data word according to respective numbers of changed bits from the reference data word;

generating a multi-bit inversion code to indicate a selection from the data word, the inverted data word, the first partially-inverted data word, and the second partially-inverted data word;

sending the selection on data conductors of the bus, while sending the multi-bit inversion code indicating an inversion condition of the selection on a Command Latch Enable (CLE) conductor and an Address Latch Enable conductor of the bus in parallel with sending the selection in a data transfer;

subsequently repurposing the CLE and ALE conductors as control lines; and sending a predetermined identifying sequence of bits on a first subset of the data conductors of the bus, while sending command data on a second subset of the data conductors of the bus and indicating a command on the CLE conductor in a command transfer.

15. The method of claim 14 wherein the data conductors consists of eight electrical conductors, the selection consists of one byte, and the multi-bit inversion code is a two-bit code.

16. The method of claim 15
wherein the predetermined identifying sequence of bits includes four bits and the command data includes four bits.

17. The method of claim 15 further comprising:
sending a predetermined identifying sequence of bits on a first subset of the first plurality of electrical conductors of the bus while sending address data on a second subset of the first plurality of electrical conductors of the bus in an address transfer.

18. The method of claim 15 further comprising:
sending a predetermined identifying sequence of bits on a first subset of the first plurality of electrical conductors of the bus while sending redundancy data on a second subset of the first plurality of electrical conductors of the bus in a redundancy transfer.

19. The method of claim 14 wherein the reference data word is a prior data word or a predetermined data word.

20. An apparatus comprising:
a means for inverting a data word;
a first partial-inversion means for inverting a first portion of the data word;
a second partial-inversion means for inverting a second portion of the data word;
an output selection means for comparing: the data word, an output of the means for inverting the data word, an output of the first partial-inversion means, and an output of the second partial-inversion means with a prior data word, and for selecting an output from the data word, the output of the means for inverting the data word, the output of the first partial-inversion means, and the output of the second partial-inversion means according to respective numbers of changed bits from the prior data word;
an output encoding circuit connected to the output selection means to generate a two-bit inversion code according to the output of the output selection means;
a command encoding circuit configured to generate an output word that includes a plurality of command or address bits and the output word includes a predetermined plurality of bits signifying the output word includes command or address bits;
a plurality of bus elements including a plurality of control bus elements and a plurality of data bus elements, the plurality of data bus elements configured to send the selected output of the output selection circuit and the plurality of control elements configured to send the two-bit inversion code indicating the inversion condition of the selected output to a selected memory die in a data transfer; and
the control bus elements configured to send the control bits and the plurality of data bus elements configured to send the plurality of command or address bits and the predetermined plurality of bits to the selected memory die in a command transfer.

* * * * *